(12) United States Patent
Engel

(10) Patent No.: US 7,018,477 B2
(45) Date of Patent: Mar. 28, 2006

(54) DISPENSING SYSTEM WITH A PISTON POSITION SENSOR AND FLUID SCANNER

(76) Inventor: Harold J. Engel, 18932 Olympia St., Northridge, CA (US) 91326

( * ) Notice: Subject to any disclaimer, the term of this patent is extended or adjusted under 35 U.S.C. 154(b) by 575 days.

(21) Appl. No.: 10/047,221

(22) Filed: Jan. 15, 2002

(65) Prior Publication Data
US 2003/0132243 A1    Jul. 17, 2003

(51) Int. Cl.
*B05C 11/10* (2006.01)

(52) U.S. Cl. .................. 118/669; 118/677; 118/681; 118/683

(58) Field of Classification Search ................ 118/669, 118/677, 679, 681, 683, 684, 685, 704; 427/8, 427/9, 10, 421, 425; 239/88, 95; 222/56
See application file for complete search history.

(56) References Cited

U.S. PATENT DOCUMENTS 5,361,963 A * 11/1994 Ozawa et al. ................. 228/33
5,782,410 A * 7/1998 Weston ......................... 239/63

FOREIGN PATENT DOCUMENTS

JP     05-208157    *    8/1993

* cited by examiner

*Primary Examiner*—George Koch
(74) *Attorney, Agent, or Firm*—Dennis A. Gross; The Hill Firm

(57) ABSTRACT

A minute quantity viscous material dispenser employing a pressurized material source and a reciprocating piston is driven by a variable drive which is controlled in response to a signal reflective of piston position and wherein the drive can be controlled for direction, stroke distance, speed, acceleration, and force and wherein the drive is coupled to the piston through a quick disconnect.

5 Claims, 3 Drawing Sheets

DISPENSING SYSTEM WITH A PISTON POSITION SENSOR AND FLUID SCANNER

BACKGROUND OF THE INVENTION

1. Field of the Invention

This invention relates to dispensing systems and, more particularly, to a computer-controlled, small quantity dispensing system for depositing controlled amounts of viscous fluids on a work piece employing a linear actuator operated piston.

2. Description of the Prior Art

Accurately controlled depositation of small quantities of viscous material on work pieces is an important part of the manufacturing process of many types of devices such as circuit boards and micro circuits. Such materials may include solder paste, adhesives, various epoxies, electrically conductive materials, potting materials, insulating materials and the like. Accurate small quantity, high speed deposition is also important in the medical fields for reagents, collegians, DNA samples and other fluids. While various systems and devices have been proposed for dispensing such materials, including drop-at-a-time dispensers, one successful approach has utilized the combination of a pressurized supply of material to a dispense chamber through which a piston moves to force predetermined quantities of material into a dispensing orifice. Such devices are shown, for example, in U.S. Pat. Nos. 4,572,103 and 4,941,428, the teachings of which are expressly incorporated herein by reference.

In such devices, the material to be dispensed is introduced to a container which may be pressurized by, for example, a supply of compressed air and which communicates via a passageway to a pre-dispense chamber positioned above and in communication with a needle-like dispensing orifice member. A piston is mounted for movement through the pre-dispense chamber into a pumping chamber open to the pre-dispense chamber and the dispensing orifice member. Movement of the piston into the pumping chamber forces material in the pumping chamber to move through the orifice member whereas withdrawal of the piston from the pumping chamber into the pre-dispense chamber permits a re-supply of material into the pumping chamber due to the pressurized supply from the container.

Such dispensing devices may have the piston actuated by means of, for example, a compressed air or hydraulic cylinder actuator. Adjustment of the amount of material to be dispensed per stroke of the piston can be made by a stroke limiter attached to the piston which can be mechanically adjusted to limit the stroke length by providing a fixed stop affixed to the piston, or to the piston actuator, or by changing the piston, pumping chamber and dispensing orifice for one of a different size.

While such devices have proven successful, they are limited in their versatility. Volumetric dispensing modifications must either be made by adjusting the stroke length of the piston manually or by replacing the piston, pumping chamber and orifice, either method creating disadvantages. Adjustments of the stop position require that the dispensing apparatus be interrupted in its cycle to allow access to the adjustment. Additionally, the adjustments are difficult to make with accuracy since they rely upon a manual repositioning of the stop and further may require many test runs before the optimum dispense volume is arrived at. Because it may be desirable to dispense different quantities at different points on a single work piece, such manual adjustment mechanisms are disadvantageous. Substitution of pistons and pumping cylinders is likewise time intensive and difficult and may involve disassembly of substantial portions of the device, a procedure that is detrimental to optimization of production runs.

It would, therefore, be an advance in the art to provide improved methods and structure for modification of the dispense volume of pressurized small quantity pump dispensers which allow rapid modifications to dispense volume to be made.

It would be a further improvement in the art to provide methods and devices allowing dispense volume modification to be made "on the fly" during operation of small quantity pre-pressurized piston pump dispensers.

It would be a further improvement in the art to provide for ease of removal of the piston and pumping chamber of a small volume, pre-pressurized piston pump dispenser.

These and other improvements are obtained by the following described invention.

SUMMARY OF THE INVENTION

A small volume dispense pump is provided with a reciprocating piston positioned concentric with a pumping chamber which is open to a pre-dispense chamber which in turn is supplied with material to be dispensed, the material being supplied under pressure. The pumping chamber is also in communication with a dispensing tip or orifice. Reciprocation of the piston into the pumping chamber, after the pumping chamber has been supplied with material from the pre-dispense chamber, acts in the manner of a hypodermic to force material through the pumping chamber, the dispensing orifice member and out of the dispensing end of the orifice member. Upon withdrawal of the piston from the pumping chamber, the pumping chamber will be refilled with material from the pre-dispense chamber. Devices of this type, shown for example in U.S. Pat. Nos. 4,941,428 and 4,572,103, are capable of repeatedly, accurately, dispensing minute quantities of material including highly viscous material. As is known in the art, actuation of the piston may be effectuated by a pneumatic cylinder which may in turn be controlled by an electro pneumatic control which in turn may be controlled by a computerized control system. The computerized control system may provide for individual stroke operation of the pump, predetermined multiple stroke operation, operation for a period of time, or any combination thereof.

Such dispensers are often employed with XYZ positioning control systems which may control either movement of the work piece, or of the dispensing orifice or a combination of both. By integrating control of XYZ axis movements with control of piston operation, it is possible to provide spot depositation of material, substantially continuous line depositation of material, dotted line depositation of material, or area fill depositation of material. By using appropriate software, it is possible to provide graphic depositation and to create pixel defined indices.

This invention controls operation of the piston through a variable stroke actuator which allows the piston to be moved by a controlled amount during the dispense cycle. In this manner, the dispense device can be adjusted automatically during operation to provide for a greater or lesser dispense quantity per stroke. Control of piston force may accommodate changing dispense needs such as might be encountered by variations in material characteristics such as viscosity changes. The invention utilizes a computer control to move the actuator. The control can stop the piston's movement at any point in its travel and can control direction, acceleration, speed and force. A piston position sensor monitors piston movement, either directly or indirectly, and provides signal input to the computer.

In a preferred embodiment, the piston is driven by an electronic linear actuator.

In an embodiment of the invention, a variable linear actuator is controllable to provide stroke length adjustment, velocity adjustment, change in velocity adjustment and force adjustment, all under computer control.

In an embodiment of the invention, the piston is coupled with a piston position sensor which provides an output signal indicative of the relative position of the piston which the computer control may utilize to control further movement of the piston.

In an embodiment of the invention, a piston position sensor is mechanically coupled to the piston for movement therewith and has a detectable portion which passes in proximity to a variable output sensor, the output of which can indicate piston position and be used to determine relative change in position and rate of change in position of the piston.

In an embodiment of the invention, the piston is coupled to the linear actuator through a magnetic coupling allowing quick disassembly of an actuator sub-assembly from a dispensing sub-assembly thereby facilitating change in piston and pumping chamber providing cleaning or for quick changes in materials and/or dispense orifice size.

It is therefor an object of this invention to provide for controlled variability during operation of a small volume reciprocating piston viscous material dispenser utilizing a controllable linear actuator driven piston.

It is another, and more specific object of this invention, to provide a computer-controlled small quantity dispensing system for depositing controlled amounts of viscous fluids on a work piece utilizing a linear actuator operated piston in conjunction with a piston position and movement sensor.

It is another object of this invention to provide a quick change small quantity dispensing system for depositing controlled amounts of viscous fluids on a work piece utilizing separable actuator and dispense sub-assemblies coupled together through a magnetic coupling.

These and other objects of this invention will become apparent to those skilled in the art from the following detailed description of one preferred embodiment, it being understood that many variations will be apparent to those of ordinary skill in the art in substitution for the specific structures disclosed in the preferred embodiment.

DESCRIPTION OF THE PREFERRED EMBODIMENT

Figure 2:
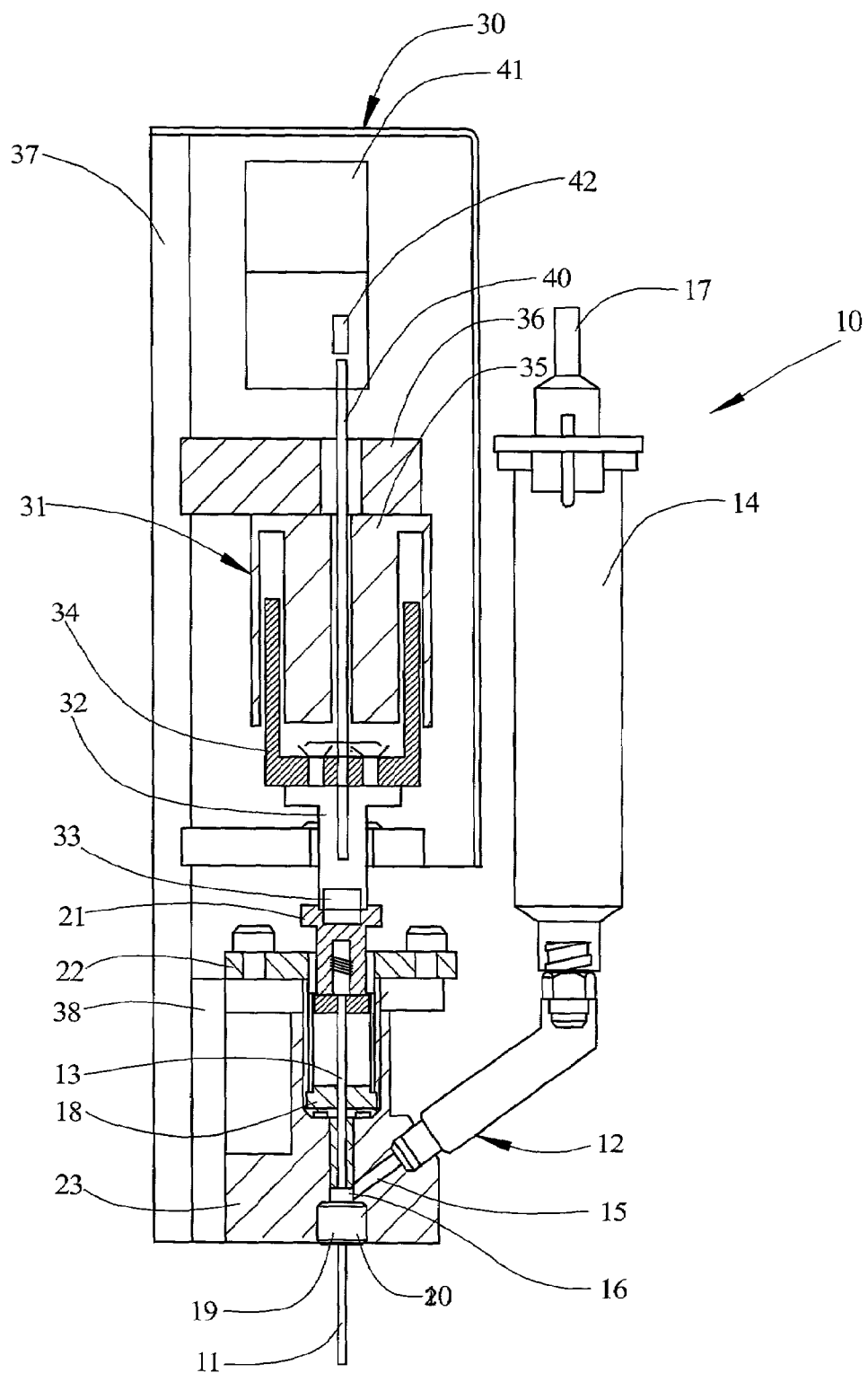
FIG. 2 is a cross-sectional view of the actuator sub-assembly and dispense subassembly.

As shown in FIG. 2, the dispenser 10 of this invention is particularly suited for extremely small volume dispensing of viscous material, for example, as would be utilized in manufacture of electronic components such as circuit boards or microcircuits. Modern manufacturing techniques emphasize extremely tight and controlled placement of minute quantities of liquid, semi-liquid and paste materials, such as, for example, fluxes, solder paste, silver, conductive epoxies, encapsulents, underfill, damfill materials, potting materials and the like which may range in viscosity from 300 centipoise to several million centipoise. Additionally, high speed manufacturing requires that the material be dispensed at extreme speeds, for example, from ten to one hundred dispense actions per second. With individual dot dispenses on the order of five to forty mils in diameter of dispensed material per dispense operation, reliable supply of material is a critical factor. Importantly, since the pot life of some materials may be on the order of twenty minutes, to a few days, and since viscosity and other material changes can take place during the pot life term, it has been found that reciprocating pistons forcing material through a needle-like dispense tip present a particularly viable solution. Thus, the dispense device 10 includes a needle-like dispense tip 11 projecting from the bottom of a dispense sub-assembly 12 which receives a reciprocating piston 13. The dispense subassembly 12 is provided with material from a material reservoir 14 through a conduit 15 open to a pre-dispense chamber 16 through which the piston 13 reciprocates. The material stored in the material reservoir 14 is acted upon by pressure such as may be supplied, for example, from an air pressure line 17. In this manner, the material in the pre-dispense chamber 16 is maintained at greater than atmospheric pressure. The pressure may be adjusted by adjusting the air pressure at line 17 to accommodate materials of differing viscosities. It will be appreciated that although I have shown an air pressure material reservoir, other methods of pressurizing may be utilized, such as, for example a moving piston chamber, a screw feed or the like.

Piston 13 is preferably received in a piston guide bushing 18 which terminates at the pre-dispense chamber in spaced relation to a pumping chamber 19. The pumping chamber 19 is received interior of a fitting 20 which may be affixed as the top-most portion of the overall dispense tip 11 assembly. The pumping chamber is dimensioned to closely receive the piston for the full pumping distance of its stroke. It will be appreciated that at the top of stroke, the piston is removed from the pumping chamber 19 and is positioned in the pre-dispense chamber so the material in the pre-dispense chamber can flow into the pumping chamber. In a typical application, vertical movement of the piston during its stroke may be on the order of 0.050 inches.

The piston is received in a coupling member 21 which in turn is bushed into a cap 22 bolted to the dispense housing 23. The coupling member 21 is reciprocal within the cap and, as illustrated, the piston may be threaded into a threaded bore in the coupling member.

Positioned above the dispense sub-assembly is an actuator sub-assembly 30 which includes a linear actuator 31 which drives a rod 32 which is coupled to the coupling member 21.

To provide for ease of disassembly of the two sub-assemblies, the rod 32 may be driveably connected to the coupling member 21 through a releasable connection such as a magnetic connector using a magnet 33. Other types of quick disconnect may be provided such as, for example, a snap lock or ball lack where automatic connection will occur when the rod is forced towards the coupling member and automatic disconnection can occur when the rod is pulled away form the coupling member with a force sufficient to overcome the lock. Where a magnetic connection is employed, as will be apparent, the magnet may be a permanent magnet, particularly in those instances when the coupling member 21 is formed of ferrous material. Alternatively, mating, but opposite high strength magnets may be carried by the coupling member 21 cooperating with the magnet 33 in the rod end. Alternatively, if desired, the magnet 33 may be an electromagnet controlled by an on/off switch to allow for positive coupling and uncoupling of the drive rod 32 and coupling member 21.

The variable linear actuator 31 may be chosen from commercially available electronic actuators including those operating on magnetic principals, mating thread principals operated by stepper motors or the like, ball threads, etc. Preferably, the variable linear actuator will have the following capabilities. It must be fast-acting, over the relatively short range of travel involved, it must be capable of being stopped, and started, at any position along its travel, it must be reversible, it must be powerful enough to dispense the most viscous material. Preferably, both its speed and force will be controllable. A currently available actuator model is available from BEI Sensors & Systems Company, Kimco Magnetics Division, San Marcos, Calif., and is believed to be described in U.S. Pat. No. 5,345,206, the teachings of which are herein incorporated by reference. As used herein the term variable linear actuator refers to those types of actuators which can impart a linear movement to the piston and which can be electronically controlled to vary stroke distance without requiring manual adjustment.

Figure 3:
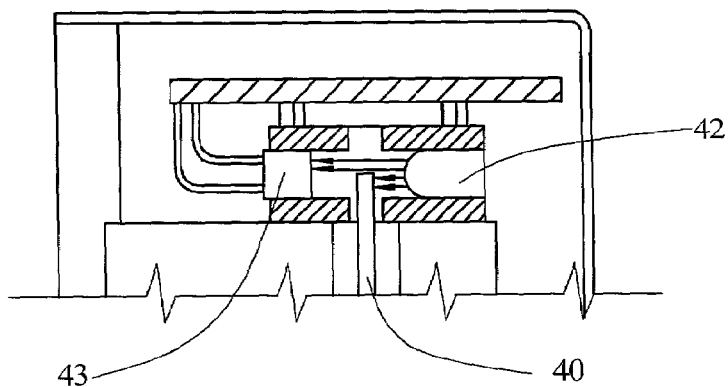
FIG. 3 is a fragmentary enlarged sectional view of the piston position sensor.

As shown in FIG. 2, the rod 32 is coupled to an axially moving portion 34 of the linear actuator which in turn is carried in a stationary portion 35 which is fixed to a bracket 36 which in turn is carried by a support 37 which also carries a bracket 38 to which the dispense sub-assembly is mounted, as by bolts. A position sensing wand or rod 40 is fixedly attached to the rod 32 and passes through the actuator 31 and bracket 36 to a sensor 41. As illustrated, this sensor may include an LED 42 and a photo detection sensor 43. As best shown in FIG. 3, the wand 40 passes between the LED 42 and the sensor 43 variably occluding light passage. Thus, the quanta of light sensed by the sensor 43 is proportional to the position of the wand between maximum and minimum levels. It will be apparent to those skilled in the art that this type of a sensor will indicate a maximum transmission of light when the piston is at its lowest position and a minimum transmission of light when the piston is at its highest position, with determinable sensitivities at any point between those positions. This allows both the position of the piston to be known instantaneously, as well as the direction of movement (increasing or decreasing light intensity), rate of change of movement ($\Delta V$) and speed.

Although I have shown the use of an LED-powered sensor, it will be understood that other types of position indicating sensors may be utilized such as, for example, an encoder, a potentiometer, a gear connection to a rotary position sensor, variable pneumatic pressure sensor or other type of position indicator. Moreover, although I have shown the sensor as being positioned on the opposite side of the actuator from the dispense sub-assembly, it would be appreciated that it could be positioned in any convenient place, such as, for example in juxtaposition to the rod, reading indices marks on the rod.

Figure 1:
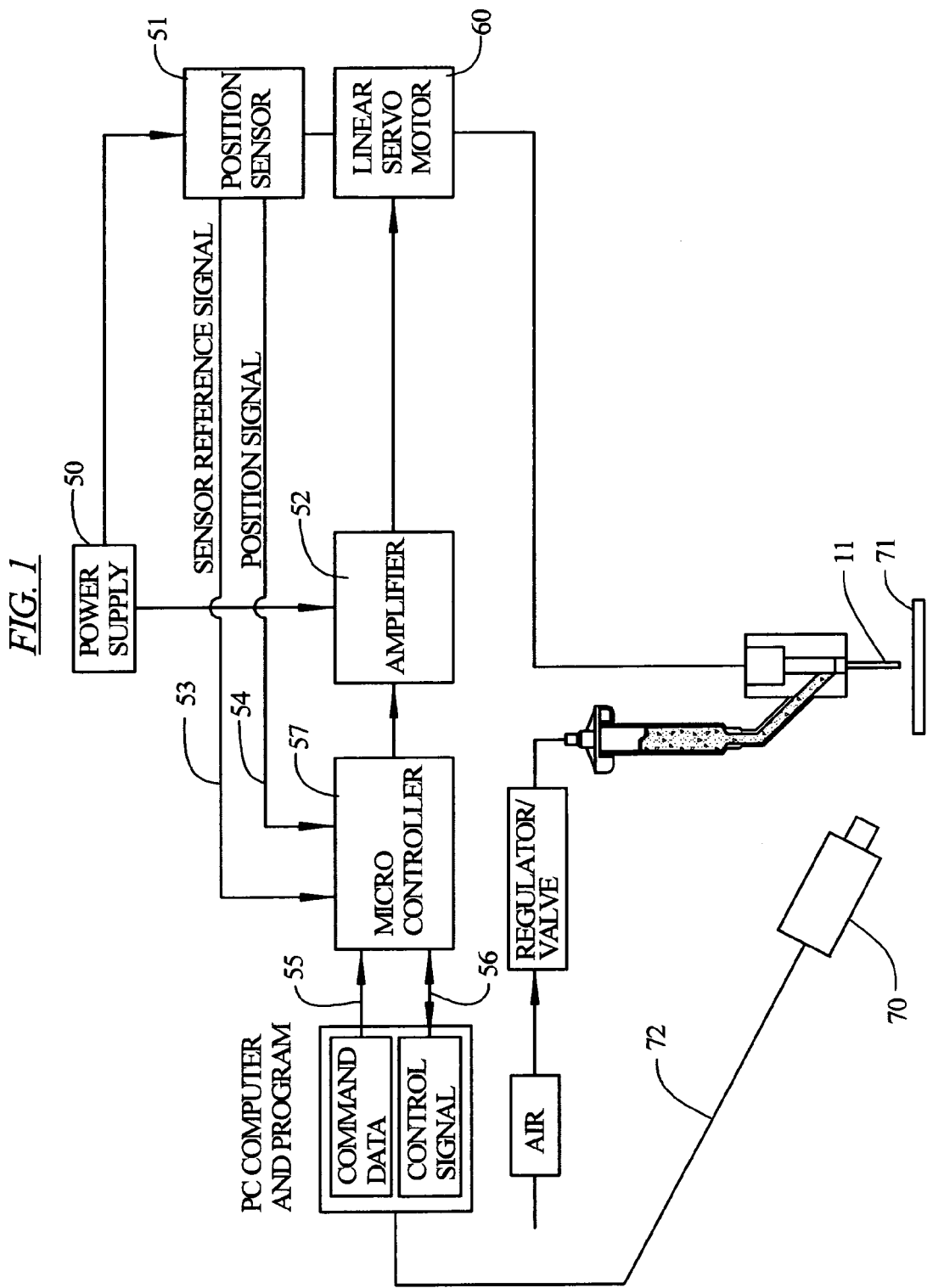
FIG. 1 is a schematic block diagram of a control system for a variable small quantity dispense system.

Through a control system such as that illustrated in FIG. 1, the combination of a sensor sensing position and movement of the piston, directly or indirectly, with a variable actuator allows for extreme versatility in dispensing. As illustrated, a power supply 50 provides power both to the position sensor assembly 51 and an amplifier 52 providing power to a servo actuator 60 or other drive structure driving the actuator. A computer control 57 receives inputs from the position sensor both with respect to a reference signal indicative of LED current photo metric output on line 53 and a position signal on line 54. The control can therefor compensate for LED aging by comparing the signal on line 53 to a base or to a history. The computer 57 may receive both command data inputs 55 and control signal inputs and outputs through a bi-directional connection 56. It will be apparent to those skilled in the art that many various subsidiary servo algorithms well known in the art may be employed to provide the various computations to output the desired signals to the actuator. It is believed that standard proportional integral differential (PID) servo algorithms can be utilized to generate desired output signals. The computer control center may, for example, consist of separate programmable controllers and micro controllers with the micro controllers interfacing between command signals from the computer or other programmable controller and output signals to the amplifier in dependent response to received signals from the position sensor.

Among the information to be provided is a command to move the piston to the full up (TDC) position, a command to dwell at either the full up position or any intermediate position, the dwell being desired to allow the material to flow into the pumping chamber from the pre-dispense chamber, movement direction commands between up and down, a full down (BDC) position, which may be desired when the dispense system is at rest so as to prevent flow of material into the pumping chamber, and command signals for velocity, acceleration and actuator force. It will be appreciated that signals from the micro processor via the bi-directional connection 56 will provide performance related information that can be compared to expected performance to allow for performance adjustment automatically. Additionally, timing signals controlling the rate of reciprocation will be provided. Further, as explained below, a disconnect position my also be programmed with the actuator raised above the TDC position of the piston.

At extremely short time intervals, the position of the wand is read via the position signal and is compared to the position desired at that instant in time. An error signal derived from that comparison can then be processed into control signals to the actuator. The computer may store historic position information to be compared with current information to determine speed, acceleration, and change in position. The amplifier can be controlled to moderate the force generated by the actuator.

The use of closed-loop feed back to establish continuous real time position control of the piston provides programmable and enhanced capabilities to the dispenser. For example, the up stroke adjustment is now programmable allowing optimization of piston pull back distance to maximize dispense speed. The use of an electronic actuator allows substantially greater speeds than pneumatic actuators. The down stroke being similarly adjustable by programming allows for variable dispense volumes per stroke controlled by programming on a dot by dot basis. This allows not only individual dot size control, but dot size reproducibility and variability. For example, a sculptured thickness, or width, of the dispensed material can be provided. This may be beneficial where, for example, it is desirable to lay down a bonding pattern to attach a component to a substrate minimizing extrusion beyond the dimensions of the component. In such an instance, a greater thickness of material can be laid down in the central areas of the component with lesser quantities toward the periphery.

Programmable velocity control allows for control of discharge velocity of the material from the dispense tip which is advantageous, particularly when using viscous materials dispensed onto fragile parts. Additionally, the programmability of acceleration allows the unit to accommodate sheer sensitive materials. Additionally, programmable force control to the actuator allows for variability in material viscosity and pressure sensitive materials. When coupled with output from the position sensor, the device may be made self cleaning in that a partial blockage can be sensed which may be cleared by a higher pressure shot or, upon failure to move the piston at forces approaching the maximum safe force for the material or a drop off in force required for movement such as may be caused by void or a bubble, the control can send a warning signal stopping operation before dispenser failure occurs. By monitoring the applied force, i.e. amplified output, and comparing it to piston movement changes, the system can sense changes in viscosity.

Additionally, by providing programmable control of the dispense operation, numerous other features and capabilities can be provided. For example, the actual position and condition of the dispensed material may be observed by means such as optical scanning and the like and be used to provide an immediate feedback to the control to provide both on-the-fly adjustments of dispense as well as to provide critical quality control allowing the system to return to an under deposited area and dispense additional material or to provide performance monitoring. In addition, the system can be made self calibrating. At start up, or at periodic intervals, test deposits can be made at different settings and sensed optically. Differences from standards or among the tests can be detected and used to calibrate the system. As shown in FIG. 1, by aiming an optical scanner or camera 70 at the work piece 71 below the tip 11 and providing output signals 72 to the computer, the actual deposit can be monitored, adjusted and compared to expected, desired or standard results. The computer then can adjust the variable linear actuator 31 as desired to maintain or obtain proper depositation. Control software for comparing stored digitized information to scanned current images and for use of such comparisons is well known to those skilled in the art and is common in manufacturing.

Figure 4:
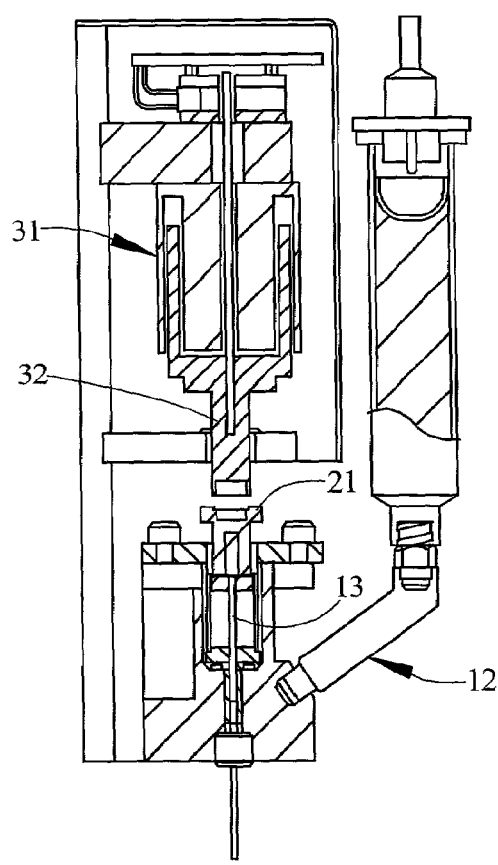
FIG. 4 is a partially schematic view similar to FIG. 2 illustrating de-coupling of the sub-assemblies.

As shown in FIG. 4, the actuator 31 is preferably provided with an additional full up position beyond the full up position for operation of the piston 13. This additional full up position decouples the rod 32 from the coupling member 21 at the magnet connection. This allows the entire dispense sub-assembly 12 to be removed from the bracket for cleaning, replacement or service without requiring any access to the actuator sub-assembly.

It will therefore be appreciated that this invention substantially improves the art of small quantity viscous fluid dispensing utilizing reciprocating pistons and provides a fully programmable dispenser where per stroke dispense volume, velocity of dispense, rate of dispense and force of dispense are all variably controlled by utilizing a variable linear actuator for driving the piston combined with a position sensing indicator and an appropriate control system. Additionally, the invention provides a unique method of coupling the actuator to the dispense sub-assembly allowing ease of maintenance and switch-out of material.

Although I have shown my invention in connection with the description of a preferred embodiment, it would be readily apparent to those of skill in the art that numerous alternatives may be unitized in place of the individual components I have chosen to illustrate. For example, although I have utilized a linear actuator positioned co-axially with the piston, it will be appreciated that other arrangements are substitutable. For example, the power section of the actuator may be positioned other than co-axial and may use a drive connection other than linear. A rotary actuator could operate a reversible rotary cam driving against a face connected to the coupling member either employing a cam track connection or a return spring or, as another example, the actuator could be electric driven such as available from Physik Instruments in Germany. Additionally, although I have shown a single piston and single dispense tip, others may wish to utilize multiple piston, multiple dispense tip constructions or different piston tip assemblies.

I claim as my invention:

1. A system for dispensing viscous fluids in small quantities comprising a reciprocal piston coupled to a variable linear actuator, a programmable controller operatively connected to the actuator, the piston moveable through a dispense stroke, the movement through the dispense stroke in a first direction effective to force a fluid to be dispensed towards a dispense tip, a piston sensor sensing the position of the piston and outputting a signal to the controller reflective of the position of the piston, the controller including a computer for comparing piston position signals to stored information and outputting control signals to the variable actuator in dependent response thereto for controlling movement of the piston, dispense tip for dispensing fluids in dependent response to a dispense stroke of the piston, a scanner positioned to detect fluid deposited on a work piece from the dispense tip, the scanner outputting signals to the controller representative of a condition of the dispensed fluid on the work piece, the controller effective to compare the dispensed fluid condition signals to stored information and to output control signals to the variable actuator in dependent response thereto for modifying a succeeding dispense stroke parameter.

2. The system in claim 1 wherein the modified parameter is dispense stroke distance.

3. The systems of claim 1 wherein the modified dispense stroke parameter is piston speed.

4. The system of claim 1 wherein the modified dispense stroke parameter is piston force.

5. The system of claim 1 wherein the modified parameter is at least one of piston stroke distance, piston movement speed, piston acceleration and piston force.

* * * * *